United States Patent [19]

Aihara

[11] 4,120,040
[45] Oct. 10, 1978

[54] ELECTRONIC CALCULATOR

[75] Inventor: Mitsuo Aihara, Tokyo, Japan

[73] Assignee: Tokyo Shibaura Electric Company, Ltd., Kawasaki, Japan

[21] Appl. No.: 849,130

[22] Filed: Nov. 7, 1977

Related U.S. Application Data

[63] Continuation of Ser. No. 666,069, Mar. 11, 1976, abandoned.

[30] Foreign Application Priority Data

Mar. 14, 1975 [JP] Japan .................................. 50-30037
Apr. 30, 1975 [JP] Japan .................................. 50-51444

[51] Int. Cl.² .......................... G06F 3/02; G06F 15/02; G04B 19/30
[52] U.S. Cl. .................................. 364/709; 58/50 R; 58/152 R; 364/705; 364/710
[58] Field of Search ............... 364/705, 708, 709, 710; 340/361, 365 R, 365 S; 58/50 R, 152 R; 235/92 DE

[56] References Cited

U.S. PATENT DOCUMENTS

| | | | |
|---|---|---|---|
| 3,553,445 | 1/1971 | Hernandex | 364/709 |
| 3,764,791 | 10/1973 | Kashio | 364/709 |
| 3,813,533 | 5/1974 | Cone et al. | 364/705 |
| 3,816,730 | 6/1974 | Yamamoto et al. | 364/705 |
| 3,852,952 | 12/1974 | Vittoz et al. | 58/50 R X |
| 3,892,958 | 7/1975 | Tung | 364/709 |
| 3,937,939 | 2/1976 | Frenkel | 364/705 |
| 3,955,355 | 5/1976 | Luce | 58/152 R X |

*Primary Examiner*—Jerry Smith
*Attorney, Agent, or Firm*—Oblon, Fisher, Spivak, McClelland & Maier

[57] ABSTRACT

An electronic calculator using a very small number of operative keys which comprises only four operative keys in all, that is, key for presetting a digit (0 to 9) of any order in a display section, the key for shifting the digit, the key for designating a specified mode from among a plurality of modes of calculating operation and the equal key for providing the result of calculating operation, wherein combination of these keys attains any desired type of function.

1 Claim, 2 Drawing Figures

ELECTRONIC CALCULATOR

This is a continuation, of application Ser. No. 666,069, filed Mar. 11, 1976 and now abandoned.

BACKGROUND OF THE INVENTION

The invention relates to an electronic calculator and more particularly to an electronic calculator using a smaller number of input means than required in the past.

Hitherto, an electronic calculator (hereinafter referred to as "EC") has been widely accepted due to its compactness, light weight and ease of operation. Research and development have been conducted to render the electronic calculator more compact and inexpensive, leading to a prominent technical progress in this particular field. Where, however, the EC is used to carry out the four rules of arithmetic, presetting of any digit of 0 to 9 is effected by the corresponding presetting key.

The four modes of arithmetic operation, namely, addition, subtraction, multiplication and division are designated by operation of four arithmetic operation mode keys bearing the corresponding notations: +, −, × and ÷. Namely, the prior art EC is provided with keys denoting the respective digits of 0 to 9 and arithmetic operation mode keys. Provision of such large number of keys has obstructed the miniaturization of EC.

On the other hand, EC concurrently acting as a timepiece has been proposed in which part of a logic circuit included in the EC is used in common to that of an electronic timepiece. However, such timepiece-type EC requires not only keys for an EC but also those for a timepiece, necessarily increasing the number of keys. Particularly, the timepiece type EC should be rendered compact. With the prior art EC, however, the number of keys can not be prominently decreased, presenting difficulties in miniaturizing a timepiece type EC.

SUMMARY OF THE INVENTION

It is accordingly the object of this invention to provide EC constructed with a smaller number of keys then required in the past.

Another object of the invention is to provide EC concurrently acting as a timepiece in which the above-mentioned EC using a small number of keys and an electronic timepiece are combined into an integral body.

According to an aspect of this invention, there is provided a novel type of EC, which comprises one system of input means for presetting a digit of any order; another system of input means for shifting a digit; arithmetic operational mode input means for designating a prescribed arithmetic operational mode; and, where these input means are combined, functional mode-defining means for effectively a functional mode associated with said combination, whereby a number of input means is considerably decreased to render the EC prominently compact.

According to another aspect of the invention, there is provided EC concurrently acting as a timepiece which is termed of EC comprising one system of input means for presetting a digit of any order, another system of input means for shifting a digit, arithmetic operational mode-designating means for defining a prescribed arithmetic operation mode, functional mode-specifying means for determining a prescribed functional mode, and display means for indicating the result of the arithmetic operation carried out by combination of those input means; an electronic timepiece provided with means for indicating time (hours, minutes and seconds) or calender date (years, months, and days), or means for indicating the days of the week, correction input means for correcting any pattern of indicated time, and designation input means for selectively specifying the display of either momentarily passing time or calender date; and switch means for changing the operation of the timepiece-type EC over to that of the EC or electronic timepiece, wherein common input means is used for the EC, as well as for an electronic timepiece, and also common display means is provided for the EC and electronic timepiece, thereby not only decreasing a number of input means and display means, but also making it possible to render the subject timepiece type EC as compact as, for example, a wrist watch due to the whole or part of the logic circuit of the EC section being used in common to that of the timepiece section.

DETAILED DESCRIPTION OF THE PREFERRED EMBODIMENTS

Figure 1:
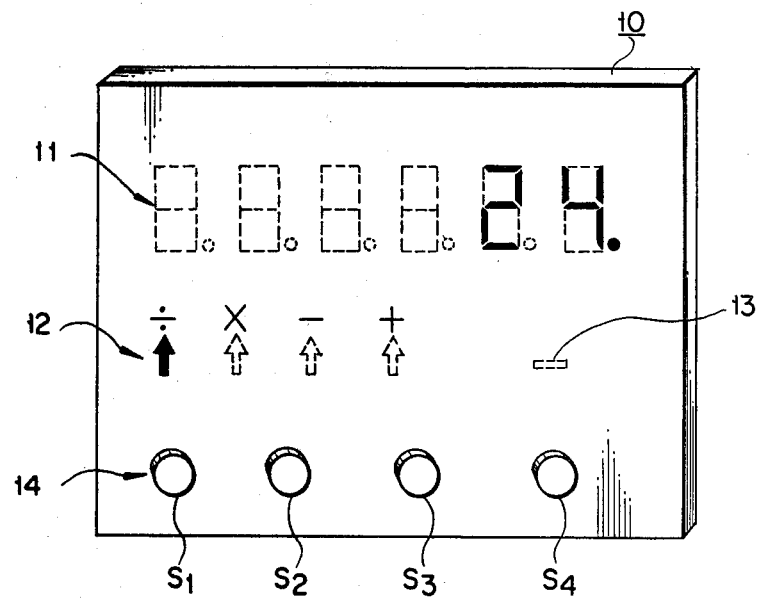
FIG. 1 represents EC according to a first embodiment of this invention and sets forth an oblique view of a display panel of the EC.

FIG. 1 illustrates a display panel of the EC of this invention. The display panel includes a display section and an input and control keyboard section. The upper part of the display panel of the EC 10 in provided with a display section 11 for indicating a 6-digit number and decimal point. The middle part of the display panel is provided with a display section for indicating an arithmetic operational mode display section 12 for indicating, for example, the four rules of arithmetic, namely, division (÷), multiplication (×), subtraction (−) and addition (+), and a display section 13 for showing whether the result of arithmetic operation has a positive or negative value. The lower part (input and control keyboard section) of the display panel is provided with the actuating keys 14 designated as S1, S2, S3, S4 required for operation of the subject EC arranged in the order mentioned as counted from the left side of FIG. 1.

The EC 10 of this invention further comprises the later described functional mode-specifying device for determining, for example, "clear" through combination of the required ones of the above-mentioned keys 14.

Now let it be assumed that the keys 14 (S1, S2, S3, S4) are designed to carry out the functions given in, for example, Table 1 below.

Table 1

| Function Key | Presetting | Shifting of digits | Designation of arithmetic operation mode | Equal | Clear |
|---|---|---|---|---|---|
| S1 | Push | | | | |
| S2 | | Push | | | |

Table 1-continued

| Function | Presetting | Shifting of digits | Designation of arithmetic operation mode | Equal | Clear | |
|---|---|---|---|---|---|---|
| S3 | | | Push | | Push | } jointly |
| S4 | | | | Push | Push | |

As apparent from Table 1 above, the key S1 is a digit-presetting key; the key S2 is a digit-shifting key; the key S3 is an arithmetic operational mode-designating key; and the key S4 is an equal key for obtaining the result of an arithmetic operation. When the keys S3, S4 are pushed jointly, date stored in a memory received in the EC 10 and in consequence indications on the display sections 11, 12, 13 are all cleared.

There will now be described the case where given numbers are subjected to arithmetic operation to obtain a desired result. Now let it be assumed that an operand "24" and an operator is "6".

In the case when a division of "24" ÷ "6" is carried out, first, the keys S3, S4 are pushed jointly to clear data preset in a memory and counter (not shown) included in the EC 10 and in consequence indications on the display sections 11, 12, 13. Then the keys S1, S2 are pushed to preset the operand "24". In this case, the key S1 is operated to preset the digit "2" representing the higher order of the operand "24" at the extreme right digit position of the numeral display section 11.

The EC 10 comprises means for counting up "+1", each time the presetting key S1 is pushed. The "+1" upcounting means can be easily provided by the already shown process. When, therefore, the key S1 is pushed two times, a digit "2" appears on the extreme right or lowest order digit position of the numeral display section 11.

Next, the digit-shifting key S2 is pushed to shift the aforesaid digit "2" from the extreme right or lowest order digit position to the left (or higher order) digit position of the numeral display section 11.

Thus, a digit incidated at the lowest digit position of the numeral display section 11 by operating of the presetting key S1 is shifted to the left, each time the digit-shifting key S2 is pushed. The numeral display section 11 comprises digit-shifting means for shifting a digit successively from the higher to the lower order digit position. The digit-shifting means can be easily provided by the known process.

The lower order digit "4" of the operand "24" is indicated by repetition of an operation similar to that described above. Namely, the digit-presetting key S1 is pushed four times to indicate a digit "4" at the lowest order digit position of the numeral display section 11. As the result, the operand "24" is indicated on the numeral display section 11, completing the presetting of the operand "24". Obviously, the operand "24" is preset in a memory (not shown) received in the EC 10.

The arithmetic operational mode-designated key S3 is operated to specify a required arithmetic operational mode. The arithmetic operational modes, namely, division (÷), multiplication (×), subtraction (−) and addition (+) are successively indicated on the arithmetic operational mode display section 12, each time the mode-designating key S3 is operated. With "24" chosen to be an operand, and "6" to be an operator, let it be assumed that, for example, the arithmetic operational mode-designating key S3 is pushed once to specify division (÷). In this case, the operator "6" is preset after designating the arithmetic operational mode of division (÷). First, the digit-presetting key S1 is pushed to clear the operand "24" indicated on the numeral display section 11, immediately displaying "1". Where the key S1 is pushed five times, the operator "6" is preset at the extreme right digit position of the numeral display section 11. Thereafter, the digit-presetting key S1 and digit-shifting key S2 are operated to preset the operator "6" and indicate it on the numeral display section 11. Under this condition, an equal key S4 is pushed to carry out a division of "24" ÷ "6", the quotient "4" being indicated on the numeral display section 11. Where, under this condition, the equal key S4 is pushed, then the operator "6" indicated up to this time on the numeral display section 11 is cleared. The above-mentioned division is carried out in an arithmetic operation circuit included in the EC 10 under control of a central circuit, and then the quotient "4" is being indicated on the numeral display section 11.

Where the succeeding mode of arithmetic operation is to be carried out, the keys S3, S4 are pushed at the same time to clear data preset in the various memories, and registers constituting an arithmetic operation memory system and the quotient "4" indicated on the numeral display section 11.

There will now be described the case where a subtraction of "10" − "15" is carried out. First, the digit-presetting key S1 and digit-shifting key S2 are operated to indicate a minuend "10" on the numeral display section 11. Next, the arithmetic operational mode-designating key S3 is operated to specify subtraction (−). After the minuend "15" is indicated by operation of the keys S1, S2, the equal key S4 is pushed to indicate an absolute value "5" showing the result of subtraction on the numeral display section 11.

A correct result of subtraction is −"5". The negativity of the result of subtraction is judged by a logic circuit for determining the positivity or negativity of a result of subtraction obtained from an arithmetic operation circuit included in the EC 10. Only where the result of subtraction has a negative value, from a negative notation "−" is indicated on the notation display section 13 of FIG. 1.

It is possible to design the subject EC such that a digit preset by the presetting key S1 is automatically increased by one per each certain length of time while said key S1 remains pushed. Where the key S1 is released when the momentarily changing (or increasing) preset digit indicates a desired value then said value is presented on the numeral display section 11. Further presetting of a digit by the presetting key S1 can also be carried out by combining means for counting up "+1", each time the presetting key S1 is pushed and means for automatically counting up "+1" for each prescribed length of time while said presetting key S1 remains pushed.

For designation of the arithmetic operational modes (÷, ×, −, +), a signal denoting a specified arithmetic operational mode may be automatically shifted through the shift register for each prescribed length of time, while the digit-shifting key S2 remains pushed.

As previously mentioned, the EC of this invention comprises only four keys and can be rendered sufficiently more compact than the conventional type to be carried, for example, on the wrist.

With the foregoing embodiment, presetting of a digit was carried out by operation of the digit-presetting key S1 and digit-shifting key S2. However, it is possible to provide the EC 10 with a timer in place of the digit-shifting key S2 and carry out digit shifting through combination of the timer and suitably chosen timing, thereby further decreasing a number of keys. Namely, a single key can be concurrently used for both presetting and shifting of a digit. This process is effected in the following manner "+1" is successively counted up, each time the digit-presetting key S1 is pushed to indicate a desired digit in the lowest order digit position of the numeral display section 11. After the digit-presetting key S1 container to be pushed for a longer time than that set by a timer, the digit-presetting key S1 is released, thereby automatically shifting a digit indicated on the numeral display section 11 to the left from the lower order digit position to the higher order digit position.

The aforesaid arithmetic operational modes consisted of the four rules arithmetic, that is, division ($\div$), multiplication ($\times$), subtraction ($-$) and addition ($+$). Where, however, it is desired to carry out any of an $n$ number of other arithmetic operational modes such as $\sqrt{\phantom{x}}$, $N^2$, sin $\alpha$, cos $\alpha$ and mode-designating keys are additionally provided in a number of 1 to $(n-1)$, then, arithmetic operation based not only on the four rules of arithmetic but also on many other modes can be carried out by operating the corresponding mode-designating keys.

Further, the digit-presetting key S1 and digit-shifting key S2 may be pushed at the same time to provide a different functional mode from the presetting and shifting of a digit carried out by said keys S1, S2 respectively. It is also possible to combine 1 to $(n-1)$ member of mode-designating keys and either digit-presetting key S1 or digit-shifting key S2 obtain a logic product of signals from these keys in an AND circuit, and supply an output signal from the AND circuit to a control circuit to effect any desired functional mode, thereby further decreasing a number of keys. A numerical value indicated on the display section 11 need not be restrictively chosen to have six digits, but may be formed of any desired number $n$ of digits.

Figure 2:
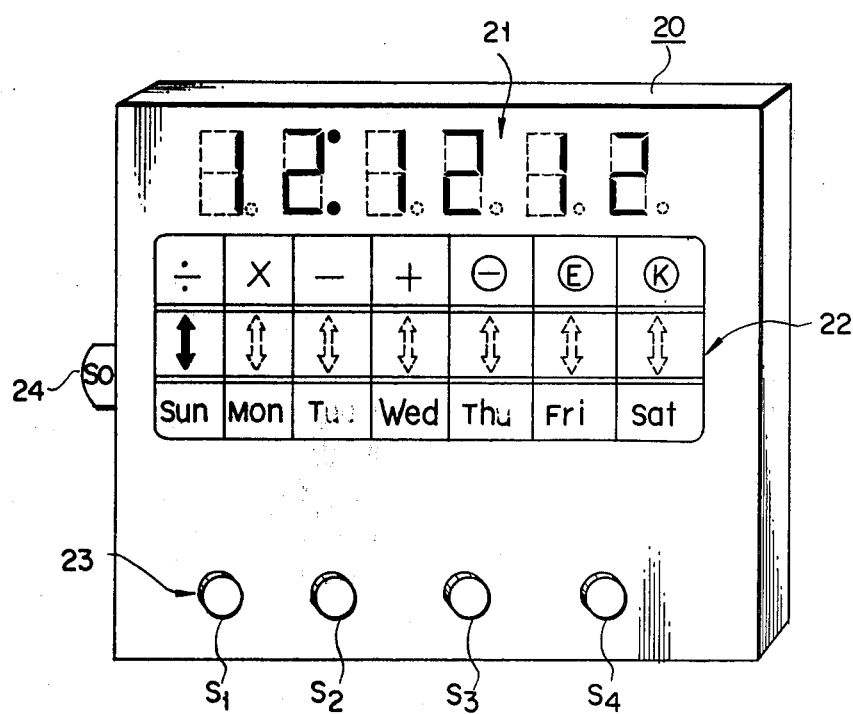
FIG. 2 is an oblique view of a display panel of a timepiece type EC according to a second embodiment of the invention.

The foregoing description refers to the EC of this invention admitting of a decrease in a number of keys. There will now be described another embodiment of the invention. This embodiment represents an electronic timepiece type EC in which the EC and timepiece sections are combined into an integral body. With this embodiment, part of the logical circuit of the EC section is used in common to that of the timepiece section. FIG. 2 illustrates the display panel of the timepiece type EC 20. The composite apparatus 20 comprises a numeral display section 21 on which a numerical value of six digits is indicated. Provided in the middle part of the display panel is a display section 22 for indicating a combination of indications relative to the EC and those relative to the timepiece. Further, four keys S1, S2, S3, S4 are disposed in the lower part of the display panel. The timepiece type EC also has a lock switch S0 24 fitted to the middle part of the left side wall of the display panel. The pull of the lock switch S0 24 causes the apparatus 20 to act as a calculator or EC and the push thereof causes said apparatus 20 to act as a timepiece. Relationship between the operation and functions of the lock switch S0 24 and four keys S1, S2, S3, S4 are set forth in Table 2 below. Referring to Table 2, "1" denotes the push of an actuating key, and "0" shows the case where said key is not pushed. With the lock switch S0, however, "1" indicates the push of the actuating key, whereas "0" represents the pull of said key.

Table 2

|  | Function | S0 | S1 | S2 | S3 | S4 |
|---|---|---|---|---|---|---|
| Calculator section | Presetting of a digit | 0 | 1 | 0 | 0 | 0 |
|  | Shifting of a digit | 0 | 0 | 1 | 0 | 0 |
|  | Designation of an operation mode | 0 | 0 | 0 | 1 | 0 |
|  | Equal | 0 | 0 | 0 | 0 | 1 |
|  | Clear | 0 | 0 | 0 | 1 | 1 |
| Timepiece section | Indication of time — Selective designation of time | 1 | 0 | 0 | 0 | 0 |
|  | Indication of time — Selective designation of calendar | 1 | 0 | 0 | 0 | 1 |
|  | Correction of time — Designation of a digit position requiring correction | 1 | 0 | 1 | 0 | 0 |
|  | Correction of time — Correction of a value appearing in said digit position | 1 | 1 | 0 | 0 | 0 |
|  | Correction of calendar — Correction of second | 1 | 0 | 0 | 1 | 0 |
|  | Correction of calendar — Designation of a digit position requiring correction | 1 | 0 | 1 | 0 | 1 |
|  | Correction of calendar — Correction of a value appearing in said digit position | 1 | 1 | 0 | 0 | 1 |

There will now be described the operation of a timepiece type EC 20 by reference to Table 2 above. Now let the case be taken where the timepiece type EC 20 is used as a calculator. Four keys S1, S2, S3, S4 are selectively pushed to carry out any of the four rules of arithmetic. Which this composite apparatus 20, the EC section uses part of its logical circuit in common to the timepiece section. Therefore, description is omitted of the arithmetic operation of the EC section which is the same as in the first embodiment. A notation ($-$) shown on the display panel means subtraction as in the first embodiment. Namely, where the result of subtraction has a negative value, an arrow section disposed immediately below the negative notation ($-$) is lighted to indicate that the result of said subtraction has a negative value. A character E is a symbol showing the occurrence of an overflow error. Namely, where a numerical value consisting of a larger number of digits than the six digits given in the numeral display section 21 is going to be preset by mistake through operation of the keys S1, S2, an arrow section positioned right below the character E is lighted to notify the presence of an overflow error. This arrangement can be easily attained by providing an overflow error detector for the subject timepiece type EC 20. A character K is a symbol denoting a constant calculation mode. Namely, the character K represents the case where a constant and a plurality of numerals are successively subjected to arithmetic operation. For example, where a series of arithmetic operations as 5 $\times$ 2, 5 $\times$ 3, 5 $\times$ 4 . . . are carried out in form, an operand, or a constant "5" is first preset by the keys S1, S2. Thereafter the key S3 is operated to designate a constant calculation mode represented by the character K. When the constant calculation mode is designated, the constant "5" and an arithmetic operation mode of multiplication are preset in a memory received in the timepiece EC 20 and also in a control circuit. The arithmetic operation of 5 × 2 is effected by presetting an operator "2" through operation of the keys S1, S2 and thereafter pushing the equal key S4. Then the result of multiplication, that is, "10" is indicated on the numeral display section 21. The succeeding arithmetic operation of 5 × 3 is carried out by presetting an operator "3" through operation of the key S4. The result of multiplication, that is, "15" in set forth on the numeral display section 21. The arithmetic operation of 5 × 4 can be similarly conducted. It is also possible to carry out another type of constant calculation mode, that is, successive division of a constant by each of a plurality of dividers. In this case, a constant or dividend and an arithmetic operation mode of division are similarly preset in a memory received in the timepiece EC 20 and also in control circuit. While the EC section of the subject composite timepiece type EC 20 is operated as a calculator, the memory included in the timepiece section remains independent of that of the EC section. Though, therefore, time indication is not made, said composite apparatus continues a time-counting action.

There will not be described the case where the timepiece section of the composite apparatus 20 is put into operation with the aforesaid lock switch S0 24 pushed. When the timepiece section begins to be operated, a point of time, for example, 12 hours-12 minutes-12 seconds is indicated in the form of 12:12 12 on the numeral display section 21. The timepiece section comprises a pulse oscillator and logit circuit, and indicates momentarily changing time in units of seconds on the numeral display section 21. Time indication is effected by supplying the respective digit position of the numeral display section 21 with an output from a different logic circuit (consisting of, for example, a 60-scale counter, 12-scale counter, etc.) from that of the EC section.

Where the key S4 is pushed while time is being indicated, then a calendar, for example, 76th year-12th month-12th day is indicated in the form of 76:12 12 on the numeral display section 21. At this time, any of the days of the week (Sunday Monday, Tuesday, Wednesday, Thursday, Friday and Saturday) is shown on the display section 22 with the corresponding arrow sign lighted. Indication of a calendar is effected by a different logic circuit displaying the year, month and day from the aforesaid logic circuit showing the hour, minute and second.

As mentioned above, operation of the timepiece section of the subject timepiece type EC is carried out by utilizing part of the logic circuit, operational keys and display section in common to the EC section of the first embodiment. Therefore the composite apparatus of this invention in which the EC and timepiece are combined into an integral body is of sufficiently simple arrangement to admit of a prominent miniaturization.

The foregoing embodiments and aspects of this invention are simply intended to clarify the technical contents of the invention. Therefore, the invention should not be narrowly constructed by being limited to such concrete examples, but can be practised in various modifications without departing from the spirit of the invention and within the range defined in the claims.

What is claimed is:
1. An electronic calculator and timepiece having only four input keys and one lockswitch capable of addition, subtraction, multiplication and division of numbers comprised of the digits 0-9 and capable of displaying the time by hours, minutes and seconds and the date by year, month, day and day of the week comprising:
  a first display section for displaying numbers to be added, numbers to be subtracted, numbers to be multiplied, numbers to be divided and numbers which constitute the result of addition, subtraction, multiplication and division,
  a second display section for displaying the addition operation, the subtraction operation, the multiplication operation and the division operation and for indicating whether the result of an addition, subtraction, multiplication or division is positive or negative,
  the only four input keys comprising:
    a digit presetting key,
    a digit shifting key,
    an arithmetic operational mode designating key,
    an equal key,
  a digit being entered and displayed in the first display section by the number of times the digit presetting key is depressed,
  a multidigit number being entered and displayed in the first display section by depressing the digit presetting key a selected number of times to enter a first digit, transferring the first digit one column to the left by depressing the digit shifting key, depressing the digit presetting key a selected number of times to enter a second digit in the column previously occupied by the first digit, transferring the first digit one further column to the left and the second digit one column to the left by depressing the digit shifting key to permit entry of a third digit in the column previously occupied by the second digit by depressing the digit presetting key a selected number of times,
  an addition, subtraction, multiplication or division operation being entered and displayed in the second display section by depressing the arithmetic operational mode designating key a predetermined number of times, the predetermined number of times being different for the addition, subtraction, multiplication and division operations,
  the result of the addition, subtraction, multiplication and division being entered and displayed in the first display section by depressing the equal key,
  the first display section being cleared by simultaneously depressing a combination of the four input keys,
  a lock switch for selecting operation as a calculator or for selecting operation as a timepiece,
  the second display section also displaying the days of the week,
  the first display section displaying the time by hours, minutes and seconds when the lock switch has selected operation as a timepiece,
  the first display section displaying the date by year, month and day and the second display section displaying the day of the week when the lock switch has selected operation as a timepiece and one of the input keys has been depressed, and
  the designation of a time digit position requiring correction, the correction of the digit appearing in the time digit position, the time correction of seconds, the designation of a calendar digit position requiring correction and the correction of the digit appearing in the calendar digit position being effected when the lock switch has selected operation as a timepiece by depressing one of the input keys or by simultaneously depressing a combination of the four input keys.

* * * * *